(12) United States Patent
Li et al.

(10) Patent No.: US 11,418,010 B2
(45) Date of Patent: Aug. 16, 2022

(54) VCSEL ARRAY WITH TIGHT PITCH AND HIGH EFFICIENCY

(71) Applicant: Apple Inc., Cupertino, CA (US)

(72) Inventors: Weiping Li, Pleasanton, CA (US); Arnaud Laflaquière, Singapore (SG); Xiaolong Fang, Fremont, CA (US)

(73) Assignee: APPLE INC., Cupertino, CA (US)

( * ) Notice: Subject to any disclaimer, the term of this patent is extended or adjusted under 35 U.S.C. 154(b) by 245 days.

(21) Appl. No.: 16/812,411

(22) Filed: Mar. 9, 2020

(65) Prior Publication Data

US 2020/0313391 A1 Oct. 1, 2020

Related U.S. Application Data

(60) Provisional application No. 62/882,534, filed on Aug. 4, 2019, provisional application No. 62/827,216, filed on Apr. 1, 2019.

(51) Int. Cl.
*H01S 5/042* (2006.01)
*H01S 5/187* (2006.01)
*H01S 5/183* (2006.01)

(52) U.S. Cl.
CPC .......... *H01S 5/187* (2013.01); *H01S 5/04253* (2019.08); *H01S 5/04254* (2019.08); *H01S 5/04256* (2019.08); *H01S 5/18341* (2013.01); *H01S 5/18344* (2013.01)

(58) Field of Classification Search
CPC .. H01S 5/187; H01S 5/04253; H01S 5/04254; H01S 5/04256; H01S 5/18341; H01S 5/18344
See application file for complete search history.

(56) References Cited

U.S. PATENT DOCUMENTS

| 5,500,540 A | 3/1996 | Jewell et al. |
| 5,867,513 A | 2/1999 | Sato |
| 6,014,400 A | 1/2000 | Kobayashi |
(Continued)

FOREIGN PATENT DOCUMENTS

| CN | 1585217 A | 2/2005 |
| CN | 1632958 A | 6/2005 |
(Continued)

OTHER PUBLICATIONS

EP Application # 17772843.3 Office Action dated Nov. 4, 2020.
(Continued)

*Primary Examiner* — Yuanda Zhang
(74) *Attorney, Agent, or Firm* — Kligler & Associates Patent Attorneys Ltd

(57) ABSTRACT

An optoelectronic device includes a semiconductor substrate. A first set of thin-film layers is disposed on the substrate and defines a lower distributed Bragg-reflector (DBR) stack. A second set of thin-film layers is disposed over the lower DBR stack and defines an optical emission region, which is contained in a mesa defined by multiple trenches, which are disposed around the optical emission region without fully surrounding the optical emission region. A third set of thin-film layers is disposed over the optical emission region and defines an upper DBR stack. Electrodes are disposed around the mesa in gaps between the trenches and are configured to apply an excitation current to the optical emission region.

17 Claims, 9 Drawing Sheets

(56) References Cited

U.S. PATENT DOCUMENTS

| | | |
|---|---|---|
| 6,057,560 A | 5/2000 | Uchida |
| 6,201,825 B1 | 3/2001 | Sakuria et al. |
| 6,317,446 B1 | 11/2001 | Wipiejewski |
| 6,327,287 B1 | 12/2001 | Kner et al. |
| 6,455,340 B1 | 9/2002 | Chua et al. |
| 6,519,271 B2 | 2/2003 | Kwon et al. |
| 6,549,556 B1 | 4/2003 | Hwang et al. |
| 6,583,445 B1 | 6/2003 | Reedy et al. |
| 6,589,805 B2 | 7/2003 | Zhu et al. |
| 6,798,806 B1 | 9/2004 | Johnson et al. |
| 6,917,640 B2 | 7/2005 | Kwak |
| 7,215,692 B2 | 5/2007 | Jewell |
| 7,415,055 B2 | 8/2008 | Deng et al. |
| 8,520,114 B2 | 8/2013 | Cok et al. |
| 8,654,811 B2 | 2/2014 | Geske et al. |
| 9,036,956 B2 | 5/2015 | Tseng et al. |
| 9,038,883 B2 | 5/2015 | Wang et al. |
| 9,157,790 B2 | 10/2015 | Shpunt et al. |
| 9,389,069 B2 | 7/2016 | Bloom et al. |
| 9,692,211 B2 | 6/2017 | Matsubara et al. |
| 9,740,032 B2 | 8/2017 | Park et al. |
| 9,742,153 B1 | 8/2017 | Barve et al. |
| 9,825,425 B2 | 11/2017 | Mor |
| 9,865,994 B2 | 1/2018 | Matsubara et al. |
| 10,082,633 B2 | 9/2018 | Schaevilz et al. |
| 10,134,945 B1 | 11/2018 | Liu et al. |
| 10,325,894 B1 | 6/2019 | Pan |
| 2002/0042187 A1 | 4/2002 | Trezza et al. |
| 2002/0075922 A1 | 6/2002 | Yoo et al. |
| 2002/0150130 A1 | 10/2002 | Coldren et al. |
| 2003/0169795 A1 | 9/2003 | Otoma et al. |
| 2003/0194168 A1 | 10/2003 | Ouchi |
| 2004/0099857 A1 | 5/2004 | Song et al. |
| 2004/0120376 A1 | 6/2004 | Kwak |
| 2004/0241892 A1 | 12/2004 | Colgan et al. |
| 2005/0169343 A1 | 8/2005 | Ostermann et al. |
| 2005/0189551 A1 | 9/2005 | Peng et al. |
| 2006/0002444 A1 | 1/2006 | Wang et al. |
| 2006/0013276 A1 | 1/2006 | McHugo |
| 2006/0033114 A1 | 2/2006 | Schranz |
| 2006/0227836 A1 | 10/2006 | Omori et al. |
| 2007/0041411 A1 | 2/2007 | Pallec et al. |
| 2007/0091961 A1 | 4/2007 | Lin et al. |
| 2007/0120206 A1 | 5/2007 | Song et al. |
| 2009/0032908 A1 | 2/2009 | Masui et al. |
| 2009/0161713 A1 | 6/2009 | Duggan et al. |
| 2010/0029027 A1 | 2/2010 | Ikuta et al. |
| 2010/0203660 A1 | 8/2010 | Tanaka |
| 2010/0208764 A1 | 8/2010 | Otoma et al. |
| 2011/0182314 A1 | 7/2011 | Yoshikawa et al. |
| 2011/0187878 A1 | 8/2011 | Mor et al. |
| 2013/0038881 A1 | 2/2013 | Pesach et al. |
| 2013/0075761 A1 | 3/2013 | Akiyama |
| 2013/0156060 A1 | 6/2013 | Futagawa et al. |
| 2013/0216247 A1 | 8/2013 | Oba et al. |
| 2013/0285115 A1 | 10/2013 | Wei et al. |
| 2013/0286614 A1 | 10/2013 | Tan et al. |
| 2014/0007935 A1 | 1/2014 | Multitu et al. |
| 2014/0211215 A1 | 7/2014 | Pesach et al. |
| 2015/0255955 A1 | 9/2015 | Wang et al. |
| 2015/0333047 A1 | 11/2015 | Pfeuffer |
| 2015/0340841 A1 | 11/2015 | Joseph |
| 2016/0377414 A1 | 12/2016 | Thuries et al. |
| 2017/0005455 A1 | 1/2017 | Padullaparth |
| 2017/0256914 A1* | 9/2017 | Hsu ............... H01S 5/0421 |
| 2017/0353012 A1 | 12/2017 | Barve et al. |
| 2018/0019302 A1 | 1/2018 | Deppe |
| 2018/0122785 A1 | 5/2018 | Fiorentino et al. |
| 2018/0241177 A1 | 8/2018 | Wong et al. |
| 2018/0287345 A1 | 10/2018 | Laflaquiere et al. |
| 2019/0036308 A1 | 1/2019 | Carson et al. |
| 2019/0164946 A1 | 5/2019 | Fu et al. |
| 2019/0250257 A1 | 8/2019 | Finkelstein et al. |
| 2019/0305522 A1 | 10/2019 | Yuen et al. |
| 2019/0346641 A1 | 11/2019 | Schlepple et al. |
| 2019/0348819 A1 | 11/2019 | Laflaquiere et al. |
| 2019/0363520 A1 | 11/2019 | Laflaquiere et al. |
| 2020/0106245 A1* | 4/2020 | Barve ............... H01S 5/0014 |

FOREIGN PATENT DOCUMENTS

| | | |
|---|---|---|
| CN | 101026211 A | 8/2007 |
| CN | 101447647 A | 6/2009 |
| CN | 101841129 A | 9/2010 |
| CN | 102354712 A1 | 2/2012 |
| CN | 103050063 A | 4/2013 |
| CN | 109378709 A | 2/2019 |
| CN | 110338815 A | 10/2019 |
| CN | 110739604 A | 1/2020 |
| EP | 0773614 A1 | 5/1997 |
| EP | 0887193 A1 | 12/1998 |
| EP | 0896405 A2 | 2/1999 |
| EP | 0949728 A1 | 10/1999 |
| EP | 1418631 A2 | 5/2004 |
| EP | 1533876 A2 | 5/2005 |
| JP | H09223848 A | 8/1997 |
| JP | H11168263 A | 6/1999 |
| JP | 2001068795 A | 3/2001 |
| JP | 3236774 B2 | 12/2001 |
| JP | 2003121611 A | 4/2003 |
| JP | 2005159071 A | 6/2005 |
| JP | 2006302981 A | 11/2006 |
| JP | 2009094308 A | 4/2009 |
| KR | 20140061117 A | 5/2014 |
| WO | 0245223 A1 | 6/2002 |
| WO | 2006003011 A1 | 1/2006 |
| WO | 2007027196 A2 | 3/2007 |
| WO | 2016122927 A1 | 8/2016 |
| WO | 2019036383 A1 | 2/2019 |

OTHER PUBLICATIONS

Park et al., U.S. Appl. No. 16/792,317, filed Feb. 17, 2020.

Choquette et al., "Advances in Selective Wet Oxidation of AlGaAs Alloys", IEEE Journal of Selected Topics in Quantum Electronics, vol. 3, issue 3, pp. 916-926, Jun. 1997.

Kumar et al., "Sacrificial etching of AlxGa1-xAs for III-V MEMS surface micromachining", Applied Physics A Materials Science & Processing, vol. 88, Issue 4, pp. 711-714, Sep. 2007.

Kim et al., "Lateral wet oxidation of AlxGa1-xAs-GaAs depending on its structure", Applied Physics Letters 39, pp. 3357-3359, year 1996.

Pu et al.: "Hybrid Integration of VCSEL's to CMOS Integrated Circuits", IEEE Journal of Selected Topics in Quantum Electronics, vol. 5, No. 2, pp. 201-208, Mar./Apr. 1999.

Neff et al., "VCSEL/CMOS smart pixel arrays for free-space optical interconnects", Proceedings of the Third International Conference on Massively Parallel Processing Using Optical Interconnections, pp. 282-289, Oct. 27-29, 1996.

Matsuo et al., "Novel technology for hybrid integration of photonic and electronic circuits", IEEE Photonics Technology Letters, vol. 8, issue 11, pp. 1507-1509, Nov. 1996.

Liu, Y., "Heterogeneous Integration of OE Arrays With Si Electronics and Micro-optics", IEEE Transactions of Advanced Packaging, vol. 25, No. 1, pp. 43-49, Feb. 2002.

Talghader., "Integration of LEDs and VCSELs using fluidic self-assembly", SPIE Proceedings, vol. 3286, pp. 86-95, Jan. 28, 1998.

Lin et al., "Ultra-compact, high-yield intra-cavity contacts for GaAs/AlGaAs-based vertical-cavity surface-emitting asers", Journal of Vacuum Science & Technology B, Nanotechnology and Microelectronics: Materials Processing, Measurement, and Phenomena, vol. 31, Section 1, pp. 011205-1-011205-6, Jan./Feb. 2013.

Sanchez et al., "Single-Mode Monolithic GaSB Vertical Cavity Surface-Emitting Laser", Optics Express, vol. 20, Issue 14, pp. 15540-15546, year 2012.

EP Application # 17772843.3 office action dated Mar. 31, 2020.

KR Application # 10-2019-7007363 office action dated Mar. 18, 2020.

JP Application # 2019-515351 office action dated Feb. 10, 2020.

(56) References Cited

OTHER PUBLICATIONS

CN Application #201780057434.7 Office Action dated Dec. 11, 2020.
NSM Archive, "Aluminium Gallium Arsenide—Optical Properties", pp. 1-2, Aug. 12, 2016.
NSM Archive, "Physical Properties of Semiconductors", p. 1, Aug. 23, 2016.
Ohiso et al., "Buried-heterostructure long-wavelength vertical-cavity surface-emitting lasers with InGaAsP/InP-GaAs/A1As DBRs," Electronics Letters, IEE 2000, vol. 36, No. 1, pp. 39-40, Jan. 6, 2000.
International Application # PCT/US2021/026939 Search Report dated Aug. 17, 2021.
U.S. Appl. No. 17/031,955 Office Action dated Sep. 14, 2021.
AU Application # 2021103713 Office Action dated Sep. 20, 2021.
Yeh et al., "Integration of GaAs vertical-cavity surface-emitting laser on Si by substrate removal," Applied Physics Letters, vol. 64, No. 12, pp. 1466-1467, Mar. 21, 1994.
U.S. Appl. No. 16/331,991 Office Action dated Oct. 7, 2021.
CN Application #2017800574347 Office Action dated Oct. 19, 2021.
CN Application #201880007030.1 office action dated Jun. 3, 2020.
International Application # PCT/US2020/21631 search report dated Jun. 16, 2020.
U.S. Appl. No. 16/477,205 office action dated Jun. 25, 2020.
International Application # PCT/US2020/18475 search report dated Apr. 17, 2020.
Lamy et al., "Design of an InGaAs/InP 1.55 μm electrically pumped VCSEL", Optical and Quantum Electronics, vol. 40, No. 14-15, pp. 1193-1198, Jun. 3, 2009.
JP Application # 2020159986 Office Action dated Nov. 8, 2021.
U.S. Appl. No. 16/331,991 Office Action dated Nov. 29, 2021.
U.S. Appl. No. 16/792,317 Office Action dated Dec. 7, 2021.
EP Application # 17772843.3 Office Action dated Apr. 7, 2022.
U.S. Appl. No. 16/331,991 Office Action dated Apr. 15, 2022.
JP Application # 2020159986 Office Action dated May 16, 2022.

\* cited by examiner

VCSEL ARRAY WITH TIGHT PITCH AND HIGH EFFICIENCY

CROSS-REFERENCE TO RELATED APPLICATION

This application claims the benefit of U.S. Provisional Patent Application 62/827,216, filed Apr. 1, 2019, and U.S. Provisional Patent Application 62/882,534, filed Aug. 4, 2019, both of which are incorporated herein by reference.

FIELD OF THE INVENTION

The present invention relates generally to optoelectronic devices, and more particularly solid-state emitter arrays and methods for their manufacture.

BACKGROUND

In vertical-cavity surface-emitting layer (VCSEL) arrays that are known in the art, multiple VCSELs are formed on a common substrate. The optical emission region of each VCSEL (which typically comprises a quantum well structure) is contained in a mesa surrounded by a trench or multiple trenches. The optical aperture of the VCSEL is defined by an oxide confinement layer surrounding the optical emission region. A metal anode contact for each VCSEL is formed over the mesa, typically in the form of a ring, which surrounds the optical aperture of the VCSEL. A common cathode contact is formed on the opposite side of the substrate.

The concentric arrangement of the optical aperture, surrounded by the anode contact, which is surrounded in turn by the trenches, sets a lower limit on the pitch of the VCSEL array: The distance between adjacent VCSELs includes both the width of the trenches and the width of the metal anode contacts.

SUMMARY

Embodiments of the present invention that are described hereinbelow provide improved solid-state emitter arrays and methods for their manufacture.

There is therefore provided, in accordance with an embodiment of the invention, an optoelectronic device, including a semiconductor substrate. A first set of thin-film layers is disposed on the substrate and defines a lower distributed Bragg-reflector (DBR) stack. A second set of thin-film layers is disposed over the lower DBR stack and defines an optical emission region, which is contained in a mesa defined by multiple trenches, which are disposed around the optical emission region without fully surrounding the optical emission region. A third set of thin-film layers is disposed over the optical emission region and defines an upper DBR stack. Electrodes are disposed around the mesa in gaps between the trenches and are configured to apply an excitation current to the optical emission region.

In a disclosed embodiment, the device includes a transparent conductive layer in electrical contact with the electrodes and extending across the mesa over at least the second set of thin-film layers.

In some embodiments, the third set of thin-film layers includes dielectric layers. Typically, the electrodes include a metal, which is deposited in vias that extend through the third set of thin-film layers.

Additionally or alternatively, the third set of thin-film layers includes epitaxial semiconductor layers. In a disclosed embodiment, the electrodes are deposited over the third set of thin-film layers.

In some embodiments, the first, second and third sets of thin-film layers and the electrodes are disposed on an upper side of the semiconductor substrate, and the device includes a cathode layer on a lower side of the semiconductor substrate, opposite the upper side.

There is also provided, in accordance with an embodiment of the invention, an optoelectronic device, including a semiconductor substrate. A first set of thin-film layers is disposed on the substrate and defines a lower distributed Bragg-reflector (DBR) stack. A second set of thin-film layers is disposed over the lower DBR stack and defines a plurality of optical emission regions, contained in respective mesas defined by multiple trenches, which are disposed around each of the optical emission regions without fully surrounding the optical emission regions. A third set of thin-film layers is disposed over each of the optical emission regions and defines an upper DBR stack. Electrodes are disposed around each of the mesas in gaps between the trenches and are configured to apply an excitation current to each of the optical emission regions.

In a disclosed embodiment, at least one of the trenches is common to a pair of neighboring mesas. Additionally or alternatively, at least one of the electrodes is common to a pair of neighboring mesas.

In some embodiments, the first, second and third sets of thin-film layers and the electrodes are disposed on an upper side of the semiconductor substrate, and the device includes a cathode layer on a lower side of the semiconductor substrate, opposite the upper side, wherein the cathode layer is common to the plurality of the optical emission regions.

There is additionally provided, in accordance with an embodiment of the invention, a method for producing an optoelectronic device. The method includes depositing a first set of thin-film layers on a semiconductor substrate so as to define a lower distributed Bragg-reflector (DBR) stack. A second set of thin-film layers is deposited over the lower DBR stack so as to an optical emission region. Multiple trenches are formed around the optical emission region without fully surrounding the optical emission region, thereby defining a mesa containing the optical emission region. A third set of thin-film layers is deposited over the optical emission region so as to define an upper DBR stack. Electrodes are deposited around the mesa in gaps between the trenches. Electrical contacts are coupled to the electrodes so as to apply an excitation current to the optical emission region.

The present invention will be more fully understood from the following detailed description of the embodiments thereof, taken together with the drawings in which:

DETAILED DESCRIPTION OF EMBODIMENTS

Overview

Embodiments of the present invention that are described herein provide a new design, in which the minimum pitch between emitters in the VCSEL array is significantly reduced by moving the metal contact ring completely out of the emitter mesa. The trenches defining the mesa are disposed around the optical emission region of the VCSEL without fully surrounding it. The electrodes (configured, for example, as metal anode contacts) are disposed around the mesa in the gaps between the trenches.

Using this design approach, the pitch of the VCSEL array can be reduced relative to devices that are known in the art, and the density of emitters on a chip can be increased. This innovation makes it possible to increase the overall radiation flux emitted from a chip of a given size, as well as generating patterns of finer resolution when the VCSEL beams are used to produce patterned illumination. Although the figures show VCSELs with a certain number of trenches and electrodes arranged symmetrically in a ring around the mesa, the principles of the present invention may alternatively be implemented using larger or smaller numbers of trenches and electrodes, which may be of the same or different relative sizes, in both symmetrical and non-symmetrical arrangements.

The changes in VCSEL geometry and reduction in size of the electrodes associated with embodiments of the present invention tend to increase the electrical resistance of the VCSEL circuits, and thus could reduce the electrical efficiency of the VCSEL array. To counteract such effects, in some embodiments a transparent conductive layer, in electrical contact with the electrodes, extends across the mesa over the optical emission region. This layer, comprising indium tin oxide (ITO), for example, can be formed either above or below the metal layer of the electrodes. It is useful in reducing the device resistance and increasing the power conversion efficiency from electrical to optical power.

The principles of the present invention can be implemented in a variety of different device technologies. For example, the VCSELs in the array may have upper mirrors comprising a distributed Bragg reflector (DBR) made up of multiple dielectric layers, or made up of multiple epitaxial p-type layers. Furthermore, the principles of the present invention may be applied in arrays of VCSELs of other types, as well as in other sorts of solid-state emitter arrays, as will be apparent to those skilled in the art after reading the present description. All such alternative implementations are considered to be within the scope of the present invention.

Figure 1:
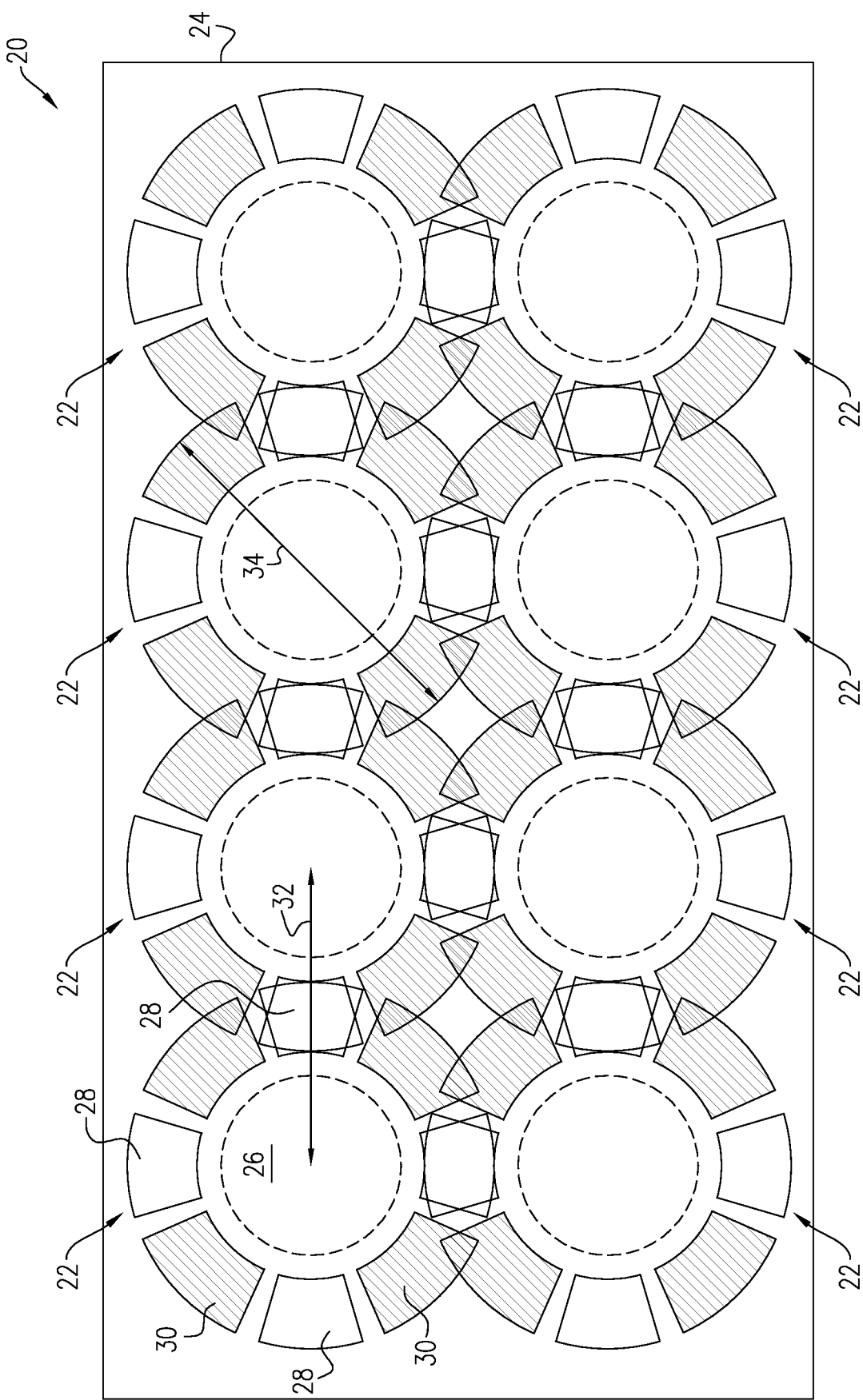
FIG. 1 is a schematic frontal view of an optoelectronic device comprising an array of VCSELs, in accordance with an embodiment of the invention.

FIG. 1 is a schematic frontal view of an optoelectronic device 20 comprising an array of VCSELs 22, in accordance with an embodiment of the invention. The structures shown in this overview figure and processes by which they can be produced are described in greater detail hereinbelow.

VCSELs 22 are formed on a semiconductor substrate 24, such as a GaAs wafer. Each VCSEL 22 emits optical radiation (typically in the near-infrared range) from an optical emission region through an aperture 26, which is defined by an oxide confinement layer within the mesa of the VCSEL. VCSELs 22 are separated from their neighbors, physically and electrically, by trenches 28 surrounding the mesas. Trenches 28 are disposed around the optical emission region of each VCSEL 22 without fully surrounding it. As a result, electrodes 30 can be disposed around the mesas in the gaps between trenches 28. These electrodes serve as anodes to apply excitation currents to the optical emission regions of the VCSELs. (The cathode, not shown in this figure, is on the lower side of substrate 24.)

The design shown in FIG. 1 is advantageous in that electrodes 30 are located outside the area of the VCSEL mesa, thus reducing an overall diameter 34 of each VCSEL relative to designs that are known in the art. Trenches or electrodes 30 of neighboring VCSELs may be overlapped, meaning that a certain trench or electrode is common to each pair of neighboring VCSELs. This overlap enables the array of VCSELs 22 to be formed on substrate 24 with a pitch 32 that is substantially smaller than diameter 34. (FIG. 1 shown an array with overlapping trenches 28, but schemes that include overlapping electrodes are also shown in the figures that follow.)

In FIG. 1, as well as in the figures that follow, some of trenches 28 and electrodes 30 are shown schematically as having arcuate shapes that overlap certain trenches and electrodes of the neighboring VCSEL 22. This feature is shown simply for convenience of illustration. In practice, trenches 28 that overlap one another actually constitute a single trench, which is shared by the neighboring VCSELs. Two electrodes 30 that overlap may actually be formed as a single electrode, which is shared by the neighboring VCSELs; or they may alternatively be limited in size so that they do not overlap, in which case each electrode serves only its own VCSEL.

Although FIG. 1 shows a rectilinear array of VCSELs, with four trenches and four electrodes of equal sizes surrounding each VCSEL, in alternative embodiments (not shown in the figures) different numbers, sizes and arrangements of trenches may be used, along with electrodes of other sizes and shapes in the gaps between the trenches surrounding the mesas. Such arrangements can also support different array geometries of the VCSELs, for example hexagonal arrays.

VCSEL Array with Dielectric DBR

Figure 2A:
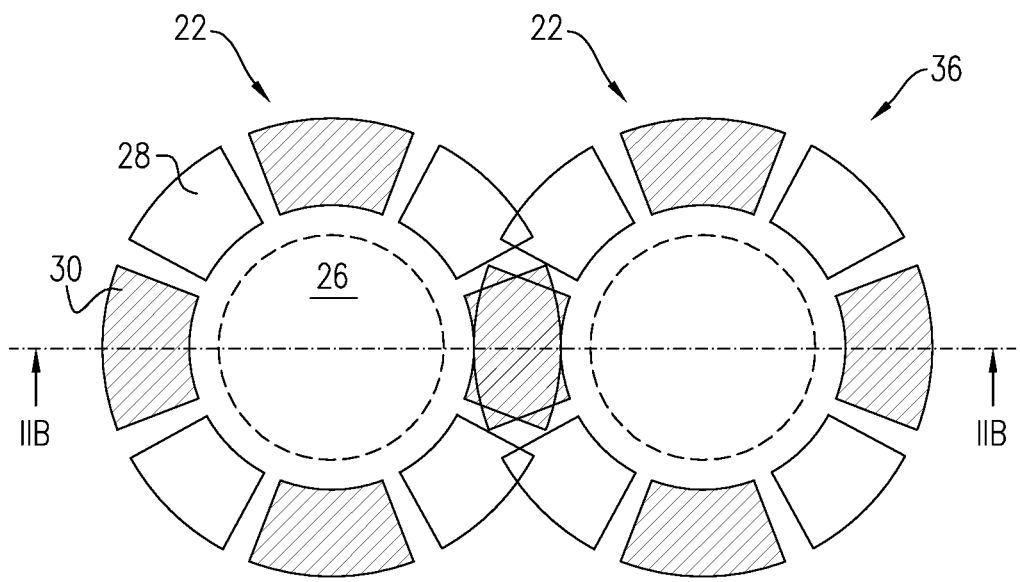
FIGS. 2A and 2B are schematic frontal and sectional views, respectively, of a pair of VCSELs in an array, in accordance with an embodiment of the invention.
Figure 2B:
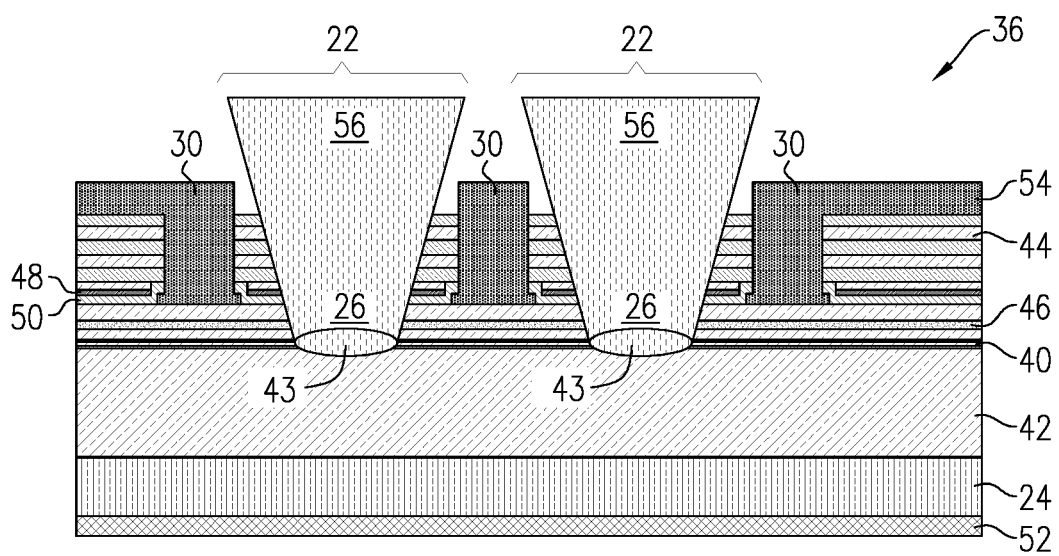

FIGS. 2A and 2B are schematic frontal and sectional views, respectively, of a pair of VCSELs 22 in an array 36, in accordance with an embodiment of the invention. The sectional view in FIG. 2B is taken along the line marked "IIB-IIB" in FIG. 2A. The sectional views in FIGS. 3B, 5B and 6B are defined by similar section lines in the corresponding frontal views. In FIG. 2A, VCSELs 22 are oriented so that electrodes 30 of the neighboring VCSELs overlap; whereas in FIG. 3A, the overlap is between trenches 28 (as in FIG. 1).

Array 36 is formed by thin-film layers deposited on the upper side of semiconductor substrate 24. (The terms "upper" and "lower" are used arbitrarily, for the sake of convenience, to indicate the order of layers in the views shown in the sectional drawings.) A first set of thin-film layers on substrate 24, typically n-type epitaxial layers having different, respective indices of refraction, define a lower distributed Bragg-reflector (DBR) stack 42. A second set of thin-film layers, deposited over lower DBR stack 42, includes a multi-quantum well (MQW) layer 40 and an overlying oxide layer 46. Trenches 28 are etched through MQW layer 40 to define the mesa of each VCSEL 22 (as shown explicitly in FIG. 3B). Oxide layer 46 is etched in each mesa to create apertures 26, which in turn define an optical emission region 43 within each mesa.

A third set of thin-film layers are formed over MQW layer 40 (and thus over optical emission region 43) to define an upper DBR stack 44. In the present embodiment, upper DBR stack 44 comprises alternating dielectric layers having different, respective indices of refraction. Vias are etched through upper DBR stack 44 and are then filled with metal to create electrodes 30 in the gaps between trenches 28.

In the pictured embodiment, a transparent conductive layer 50 extends across the mesas of VCSELs 22, above MQW layer 40 and oxide layer 46, and makes electrical contact with electrodes 30. Layer 50 may comprise indium tin oxide (ITO), for example. In addition, the sidewalls of trenches (as seen in FIG. 3B) may be coated with a passivation layer 48. Alternatively or additionally, the trenches may be filled with the one or more of the dielectric materials that are deposited to form upper DBR stack 44.

Finally, metal contact pads 54 are formed on the upper surface of upper DBR stack 44, contacting electrodes 30; and a common metal cathode layer 52 is formed on the lower surface of substrate 24. (Typically, substrate 24 is thinned before application of cathode layer 52.) When an excitation current is applied between pads 54 and cathode layer 52, it gives rise to emission of respective beams 56 of radiation from optical emission regions 43 of VCSELs 22.

Figure 3A:
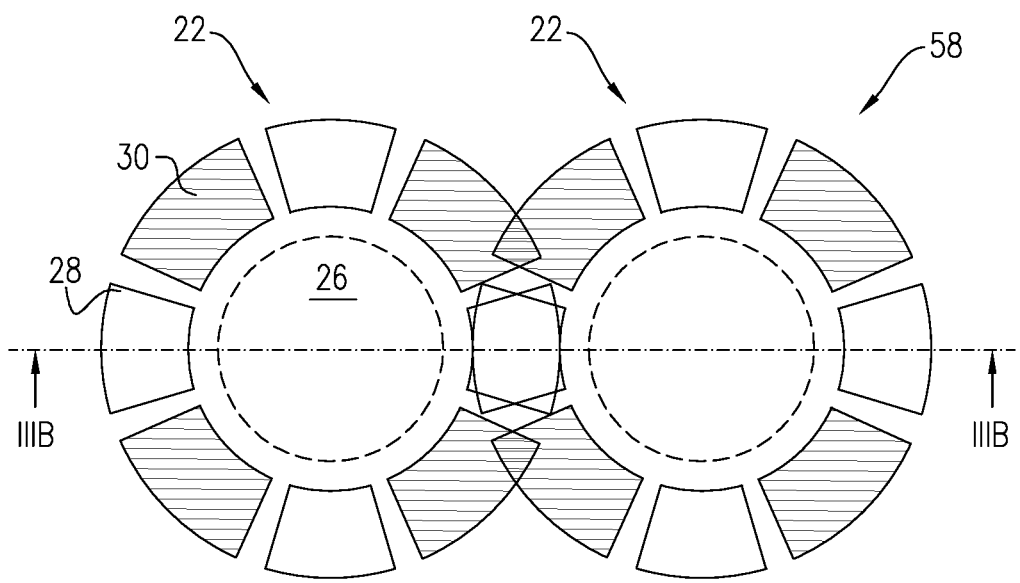
FIGS. 3A and 3B are schematic frontal and sectional views, respectively, of a pair of VCSELs in an array, in accordance with an alternatively embodiment of the invention.
Figure 3B:
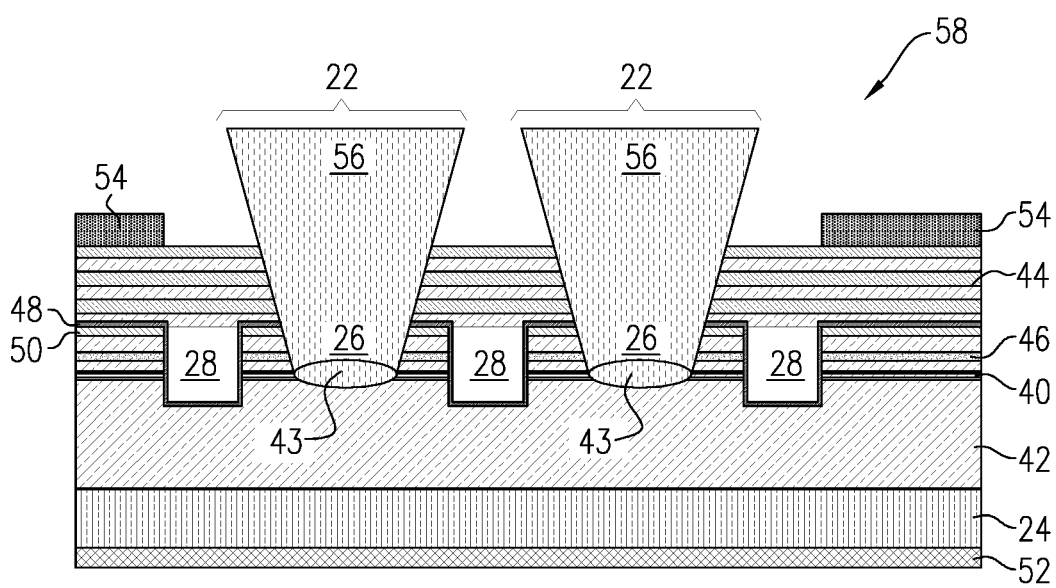

FIGS. 3A and 3B are schematic frontal and sectional views, respectively, of a pair of VCSELs 22 in an array 58, in accordance with an alternative embodiment of the invention. VCSELs 22 in this embodiment are substantially identical to those shown and described above; and like elements in this and subsequent figures are marked with the same indicator numbers as those in FIGS. 2A and 2B. In array 58, however, trenches 28 of adjacent VCSELs overlap one another, in contrast to array 36, in which electrodes 30 overlap. The sectional view of FIG. 3B thus shows trenches 28 extending through MQW layer 40 to the upper part of lower DBR stack 42 and separating the mesas of the adjacent VCSELs.

FIGS. 4A-4G are schematic sectional views showing successive stages in the fabrication of an array of VCSELs 22, such as array 36 or array 58, in accordance with an embodiment of the invention. For the sake of compact illustration, FIGS. 4C-4G combine the separate views of FIGS. 2B and 3B, meaning that electrodes 30 are shown as though they overlapped trenches 28, rather than showing two different cross-sections at each stage. Passivation layer is also omitted from these figures for the sake of simplicity.

Figure 4A:
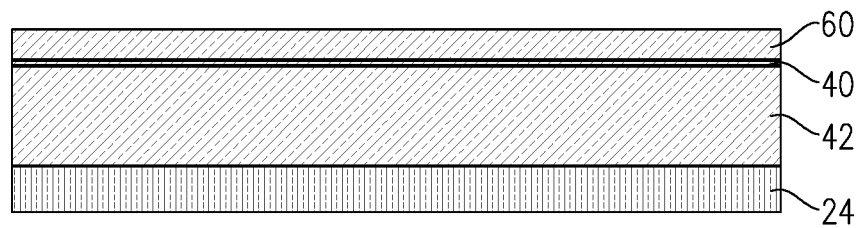
FIGS. 4A-4G are schematic sectional views showing successive stages in the fabrication of an array of VCSELs, in accordance with an embodiment of the invention.
Figure 4B:
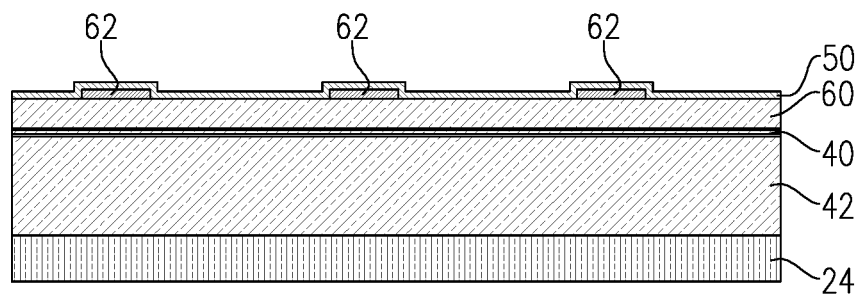

In preparation for VCSEL formation, a succession of epitaxial layers are deposited on substrate 24, as shown in FIG. 4A, beginning with n-type lower DBR stack 42, followed by MQW layer 40. An oxide aperture layer 60 is formed over the MQW layer. As a base for deposition of electrodes 30, a metal contact layer 62 is deposited over layer 60 at the intended location of each electrode, as shown in FIG. 4B. Transparent conductive layer 50 is then deposited over contact layer 62. Alternatively, the order of deposition of layers 50 and 62 may be reversed.

Figure 4C:
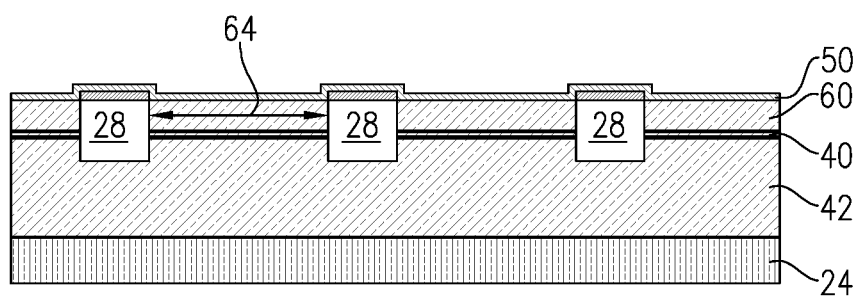
Figure 4D:
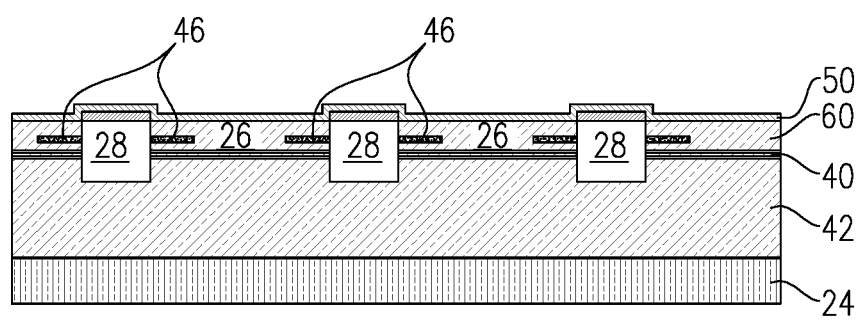

Next, as shown in FIG. 4C, trenches 28 are etched through layers 50, 60 and 40, down to lower DBR stack 42, thus defining a respective mesa 64 of each VCSEL 22 that is to be formed in the array. In addition, to increase the electrical efficiency of the VCSELs, protons may be implanted outside the mesa areas to provide electrical isolation between the mesas, thus reducing the current leakage through the area between the mesas and forcing all the currents to pass through emission regions 43. Oxide aperture layer 60 is processed, for example by etching laterally inward from trenches 28, to produce oxide layer 46, which defines apertures 26, as shown in FIG. 4D. Oxide layer 46 provides for confinement of both electrical current flow to emission region 43 and the resulting optical emission from the emission region within each mesa 64.

Figure 4E:
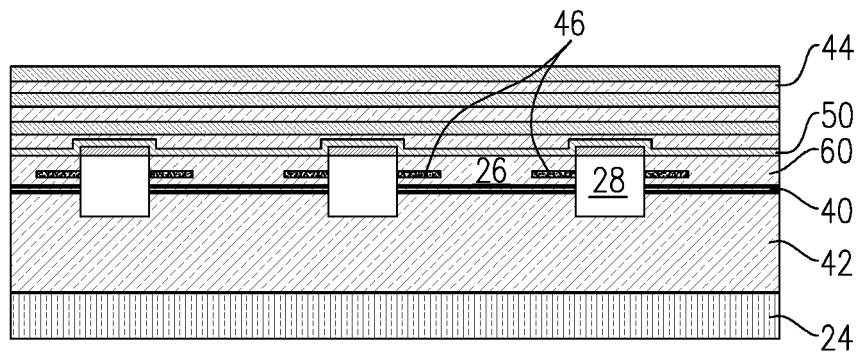
Figure 4F:
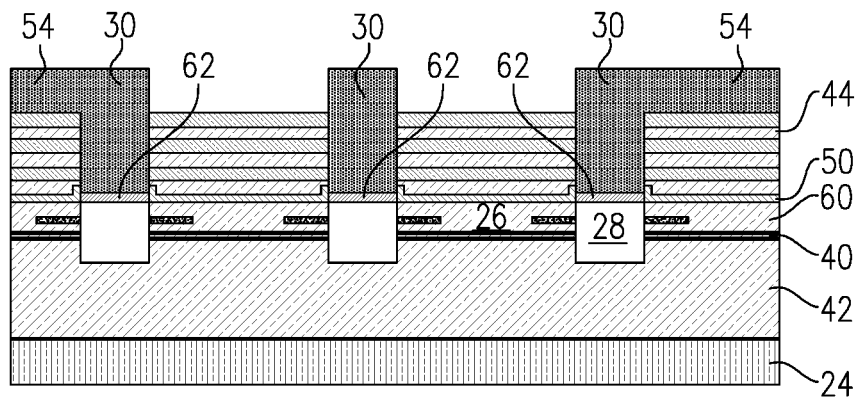
Figure 4G:
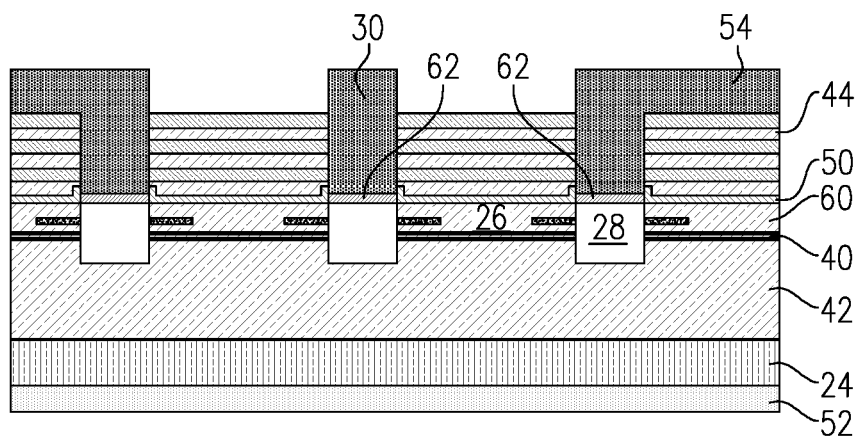

Alternating dielectric layers are now deposited over transparent conductive layer 50 in order to form upper DBR stack 44, as shown in FIG. 4E. Vias are etched through upper DBR stack 44, down to contact layer 62. These vias are filled with metal to form electrodes 30, as shown in FIG. 4F. Metal contact pads 54 are deposited over the upper surface of upper DBR stack 44 to connect with electrodes 30. At this stage, substrate 24 is typically thinned, for example by etching or polishing (not illustrated in the figures), and metal cathode layer 52 is deposited on the back side of the substrate, as shown in FIG. 4G. Application of an electrical current between contact pads 54 and cathode layer 52 will now give rise to laser emission through apertures 26.

VCSEL Array with Semiconductor DBR

Figure 5A:
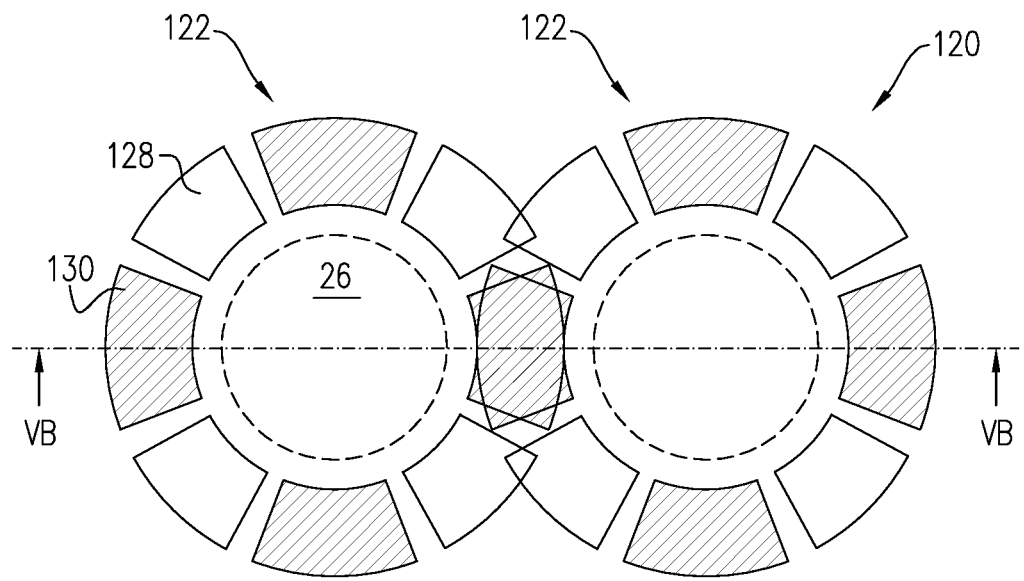
FIGS. 5A and 5B are schematic frontal and sectional views, respectively, of a pair of VCSELs in an array, in accordance with another embodiment of the invention.
Figure 5B:
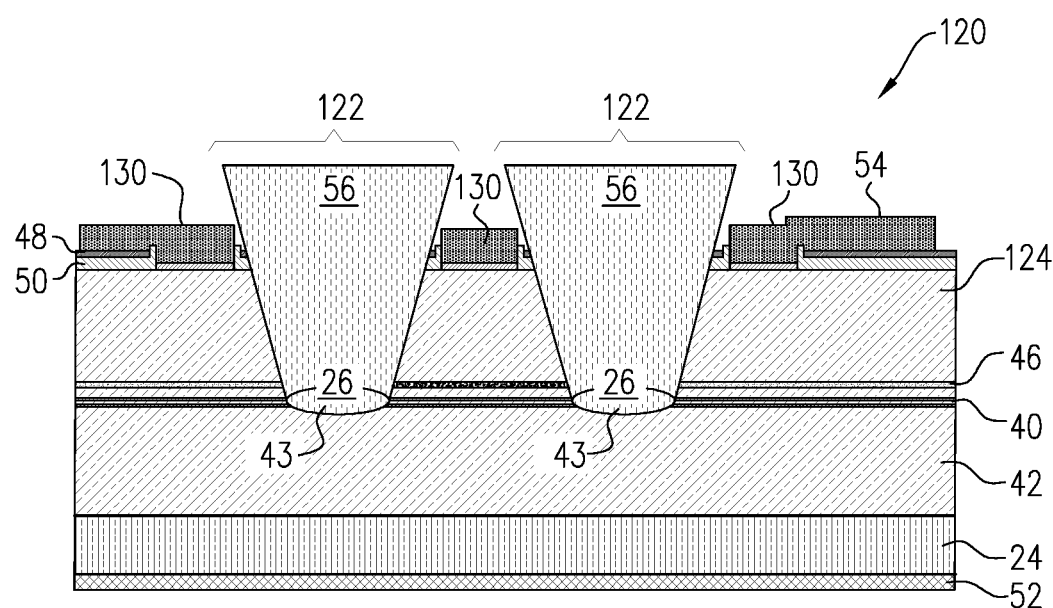

FIGS. 5A and 5B are schematic frontal and sectional views, respectively, of a pair of VCSELs 122 in an array 120, in accordance with a further embodiment of the invention. This embodiment is similar to that shown in FIGS. 2A/B and described above, except that upper DBR stack 124 in VCSELs 122 comprises a stack of alternating p-type epitaxial layers. Because of the conductivity of these layers, electrodes 130 can be deposited over the upper surface of upper DBR stack 124, rather than in vias penetrating through the stack as in the preceding embodiments.

Other than these differences, VCSELs 122 are similar to VCSELs 22, as described above, and like elements in this and subsequent figures are marked with the same indicator numbers as those in FIGS. 2A and 2B. As in FIG. 2A, VCSELs 122 in array 120 are oriented so that electrodes 130 of the neighboring VCSELs overlap. Electrodes 130 are disposed around the mesas of the respective VCSELs in gaps between trenches 128.

Figure 6A:
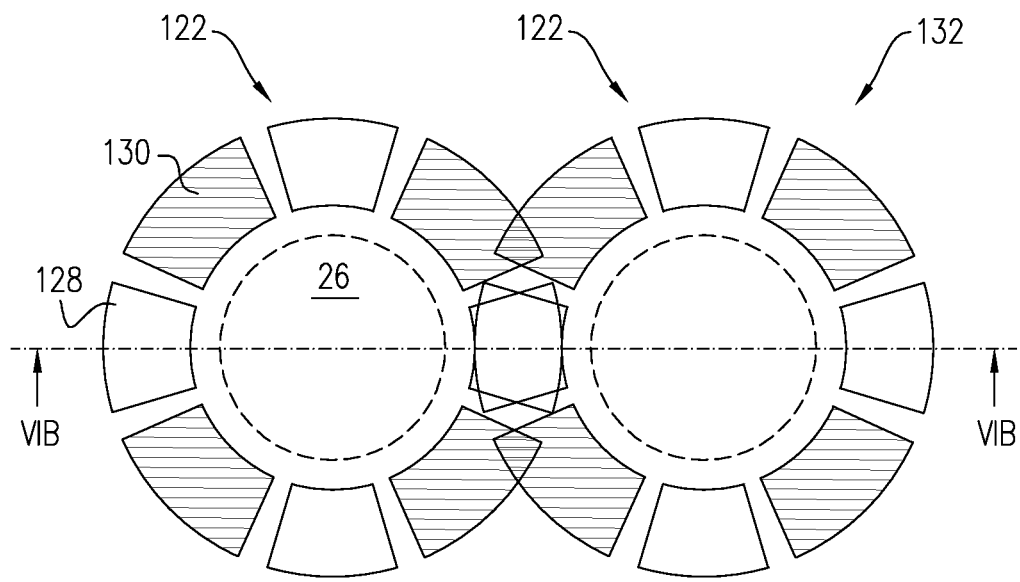
FIGS. 6A and 6B are schematic frontal and sectional views, respectively, of a pair of VCSELs in an array, in accordance with a further alternative embodiment of the invention.
Figure 6B:
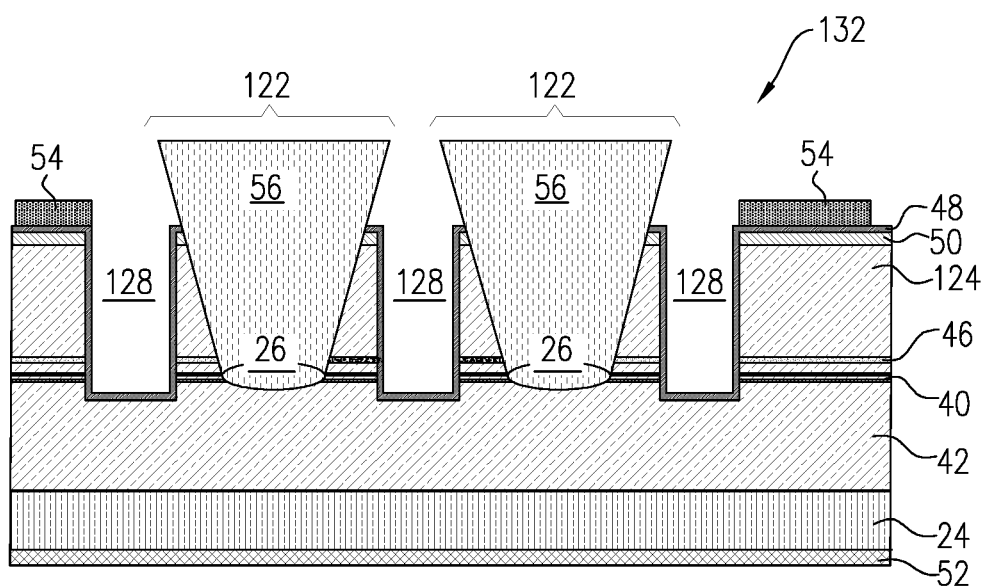

FIGS. 6A and 6B are schematic frontal and sectional views, respectively, of a pair of VCSELs 122 in an array 132, in accordance with an alternative embodiment of the invention. VCSELs 122 in this embodiment are substantially identical to those shown and described above with reference to FIGS. 5A/B. In array 132, however, trenches 128 of adjacent VCSELs overlap one another, in contrast to array 120, in which electrodes 130 overlap. The sectional view of FIG. 6B thus shows trenches 128 extending through upper DBR stack 124 and MQW layer 40 to the upper part of lower DBR stack 42 and separating the mesas of the adjacent VCSELs. Trenches 128 may be filled for example, by passivation layer 48, as shown in FIG. 6B, or alternatively or additionally, by metal from the layer of contact pads 54.

FIGS. 7A-7F are schematic sectional views showing successive stages in the fabrication of an array of VCSELs 122, such as array 120 or array 132, in accordance with an embodiment of the invention. Again, for the sake of compact illustration, FIGS. 7C-7F combine the separate views of FIGS. 5B and 6B, meaning that electrodes 130 are shown as though they overlapped trenches 128, rather than showing two different cross-sections at each stage. Passivation layer 48 is also omitted from these figures for the sake of simplicity.

Figure 7A:
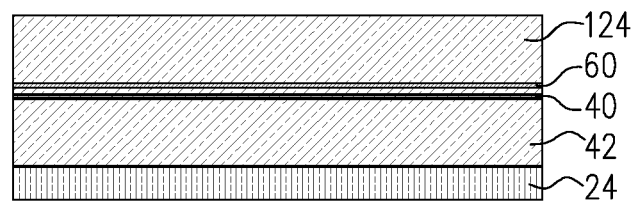
FIGS. 7A-7F are schematic sectional views showing successive stages in the fabrication of an array of VCSELs, in accordance with another embodiment of the invention.
Figure 7B:
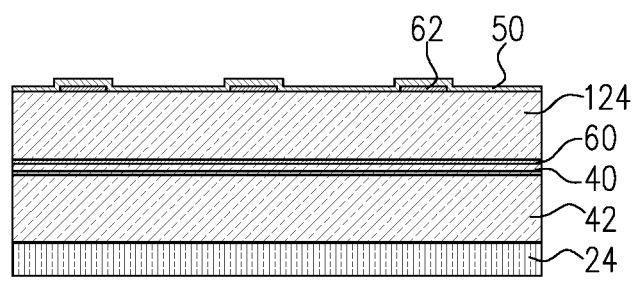

In preparation for VCSEL formation, a succession of epitaxial layers are deposited on substrate 24, as shown in FIG. 7A, beginning with n-type lower DBR stack 42, followed by MQW layer 40. Oxide aperture layer 60 is formed over the MQW layer, and p-type upper DBR stack 124 is deposited over layer 60. As a base for deposition of electrodes 130, metal contact layer 62 is deposited over upper DBR stack 124 at the intended location of each electrode, as shown in FIG. 7B. Transparent conductive layer 50 is then deposited over contact layer 62. Alternatively, the order of deposition of layers 50 and 62 may be reversed.

Figure 7C:
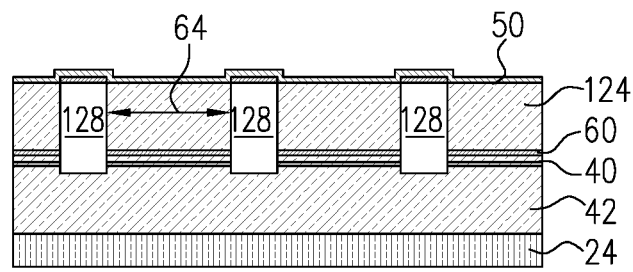
Figure 7D:
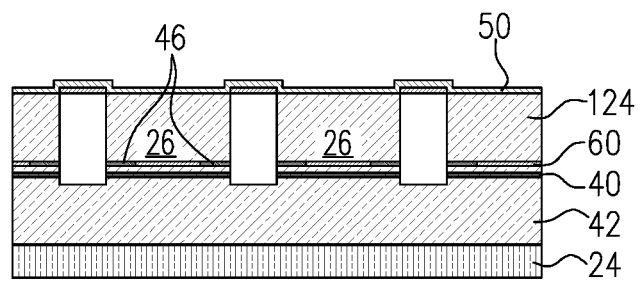
Figure 7E:
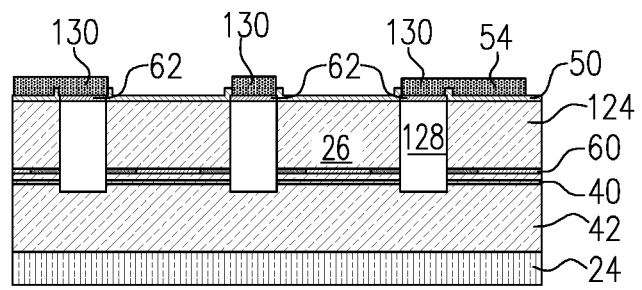

Next, as shown in FIG. 7C, trenches 128 are etched through layer 50, upper DBR stack 124, and layers 60 and 40, down to lower DBR stack 42. Trenches 128 thus define mesa 64 for each VCSEL 122 that is to be formed in the array. Protons may be implanted in the areas between the mesas to increase the electrical efficiency, as explained above. Oxide aperture layer 60 is processed, for example by etching laterally inward from trenches 28, to produce oxide layer 46, thus defining apertures 26, as shown in FIG. 7D.

Figure 7F:
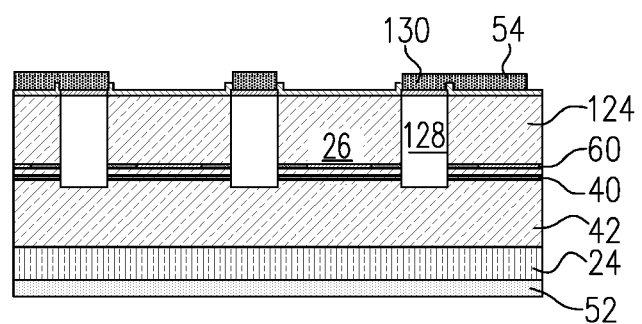

Next, as shown in FIG. 4E, metal electrodes 130 are deposited over contact layer 62, and contact pads 54 are deposited over the upper surface of upper DBR stack 124 to connect with electrodes 130. At this stage, substrate 24 is typically thinned, for example by etching or polishing (not illustrated in the figures), and metal cathode layer 52 is deposited on the back side of the substrate, as shown in FIG. 7F. Application of an electrical current between contact pads 54 and cathode layer 52 will now give rise to laser emission through apertures 26.

Although the embodiments that are shown in the figures and described above relate specifically to VCSELs, the principles of the present invention may similarly be applied to other sorts of surface-emitting solid-state devices, such as resonant-cavity light-emitting diodes (RCLEDs). It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
a semiconductor substrate;
a first set of thin-film layers disposed on the substrate and defining a lower distributed Bragg-reflector (DBR) stack;
a second set of thin-film layers disposed over the lower DBR stack and defining an optical emission region, which is contained in a mesa defined by multiple trenches, which are disposed around the optical emission region without fully surrounding the optical emission region;
a third set of thin-film layers disposed over the optical emission region and defining an upper DBR stack;
a transparent conductive layer disposed between the optical emission region and the upper DBR stack and extending across the mesa over at least the second set of thin-film layers; and
electrodes, which are disposed around the mesa in gaps between the trenches in electrical contact with the transparent conductive layer and are configured to apply an excitation current through the transparent conductive layer to the optical emission region.

2. The device according to claim 1, wherein the third set of thin-film layers comprises dielectric layers.

3. The device according to claim 2, wherein the electrodes comprise a metal, which is deposited in vias that extend through the third set of thin-film layers.

4. The device according to claim 1, wherein the third set of thin-film layers comprises epitaxial semiconductor layers.

5. The device according to claim 4, wherein the electrodes are deposited over the third set of thin-film layers.

6. The device according to claim 1, wherein the first, second and third sets of thin-film layers and the electrodes are disposed on an upper side of the semiconductor substrate, and the device comprises a cathode layer on a lower side of the semiconductor substrate, opposite the upper side.

7. The device according to claim 1, wherein the transparent conductive layer comprises indium tin oxide (ITO).

8. An optoelectronic device, comprising:
a semiconductor substrate; and
a first set of thin-film layers disposed on the substrate and defining a lower distributed Bragg-reflector (DBR) stack;
a second set of thin-film layers disposed over the lower DBR stack and defining a plurality of optical emission regions, contained in respective mesas defined by multiple trenches, which are disposed around each of the optical emission regions without fully surrounding the optical emission regions;
a third set of thin-film layers disposed over each of the optical emission regions and defining an upper DBR stack;
a transparent conductive layer disposed between the optical emission region and the upper DBR stack and extending across the mesas over at least the second set of thin-film layers; and
electrodes, which are disposed around each of the mesas in gaps between the trenches in electrical contact with the transparent conductive layer and are configured to apply an excitation current through the transparent conductive layer to each of the optical emission regions.

9. The device according to claim 8, wherein at least one of the trenches is common to a pair of neighboring mesas.

10. The device according to claim 8, wherein at least one of the electrodes is common to a pair of neighboring mesas and is shared in providing the excitation current to both of the mesas in the pair.

11. The device according to claim 8, wherein the first, second and third sets of thin-film layers and the electrodes are disposed on an upper side of the semiconductor substrate, and the device comprises a cathode layer on a lower side of the semiconductor substrate, opposite the upper side, wherein the cathode layer is common to the plurality of the optical emission regions.

12. A method for producing an optoelectronic device, the method comprising:
depositing a first set of thin-film layers on a semiconductor substrate so as to define a lower distributed Bragg-reflector (DBR) stack;

depositing a second set of thin-film layers over the lower DBR stack so as to an optical emission region;

forming multiple trenches around the optical emission region without fully surrounding the optical emission region, thereby defining a mesa containing the optical emission region;

depositing a third set of thin-film layers over the optical emission region so as to define an upper DBR stack;

depositing a transparent conductive layer between the optical emission region and the upper DBR stack and extending across the mesa over at least the second set of thin-film layers;

depositing electrodes around the mesa in gaps between the trenches in electrical contact with the transparent conductive layer; and coupling electrical contacts to the electrodes so as to apply an excitation current through the transparent conductive layer to the optical emission region.

13. The method according to claim 12, wherein the third set of thin-film layers comprises dielectric layers.

14. The method according to claim 13, wherein depositing the electrodes comprises etching vias through the third set of thin-film layers, and filling the vias with a metal.

15. The method according to claim 12, wherein the third set of thin-film layers comprises epitaxial semiconductor layers.

16. The method according to claim 15, wherein the electrodes are deposited over the third set of thin-film layers.

17. The method according to claim 12, wherein the first, second and third sets of thin-film layers and the electrodes are deposited on an upper side of the semiconductor substrate, and the method comprises depositing a cathode layer on a lower side of the semiconductor substrate, opposite the upper side.

* * * * *